United States Patent [19]
Yu

[11] Patent Number: 5,949,634
[45] Date of Patent: Sep. 7, 1999

[54] ELECTROSTATIC DISCHARGE PROTECTION CIRCUIT TRIGGERED BY MOS TRANSISTOR

[75] Inventor: Ta-Lee Yu, Hsinchu Hsien, Taiwan

[73] Assignee: Winbond Electronics Corporation, Hsinchu, Taiwan

[21] Appl. No.: 09/055,618

[22] Filed: Apr. 6, 1998

[30] Foreign Application Priority Data

Mar. 4, 1998 [TW] Taiwan ................................. 87103158

[51] Int. Cl.⁶ ..................................................... H02H 3/00
[52] U.S. Cl. ............................ 361/111; 361/56; 361/117; 361/119; 361/127
[58] Field of Search ............................... 361/56, 91, 111, 361/117, 118, 119, 127

[56] References Cited

U.S. PATENT DOCUMENTS

5,400,202  3/1995  Metz et al. ................................. 361/56

Primary Examiner—Stephen Jackson
Attorney, Agent, or Firm—Fish & Richardson P.C.

[57] ABSTRACT

An electrostatic discharge protection circuit comprises an NMOS transistor and a silicon-controlled rectifier. The NMOS transistor is configured with one source/drain region connected to a first node, and its gate as well as another source/drain region connected to a second node. The silicon-controlled rectifier comprises a PNP transistor, an NPN transistor, and a resistor. The PNP transistor is provided with a first emitter connected to the first node, a first base disconnected from the first node, and a first collector. The NPN transistor is provided with a second emitter connected to the second node, a second base connected to the first collector and a second collector connected to the first base. However, the resistor is connected between the second base and the second node. The NMOS transistor enters breakdown to trigger the silicon-controlled rectifier to conduct a discharge current when electrostatic discharge stress occurs between the first node and the second node.

19 Claims, 6 Drawing Sheets

ELECTROSTATIC DISCHARGE PROTECTION CIRCUIT TRIGGERED BY MOS TRANSISTOR

BACKGROUND OF THE INVENTION

The present invention generally relates to electrostatic discharge protection techniques for semiconductor integrated circuitry, and, more specifically, relates to an electrostatic discharge protection triggered by a MOS transistor.

DESCRIPTION OF THE PRIOR ART

Electrostatic discharge, ESD hereinafter, is a common phenomenon that occurs during handling of semiconductor integrated circuit ("IC") devices. Electrostatic charges may accumulate and cause potentially destructive effects on an IC device. ESD stressing typically can occur during a testing phase of IC fabrication, during installation of the IC onto a circuit board, as well as during use of equipment into which the IC has been installed. Damage to a single IC due to poor ESD protection in an electronic device can partially or sometimes completely hamper its operation.

However, sub-micron CMOS ICs have become increasingly vulnerable to ESD damage due to advanced processes, such as the use of a lightly-doped drain ("LDD") structure and clad silicide diffusions. Therefore, lateral silicon-controlled rectifiers (LSCRs) have been proposed, for example, in U.S. Pat. No. 5,012,317, as ESD protection circuits for facilitating ESD protection. The cross-sectional view of a conventional lateral silicon-controlled rectifier fabricated onto a semiconductor substrate is illustrated in FIG. 1.

Figure 1:
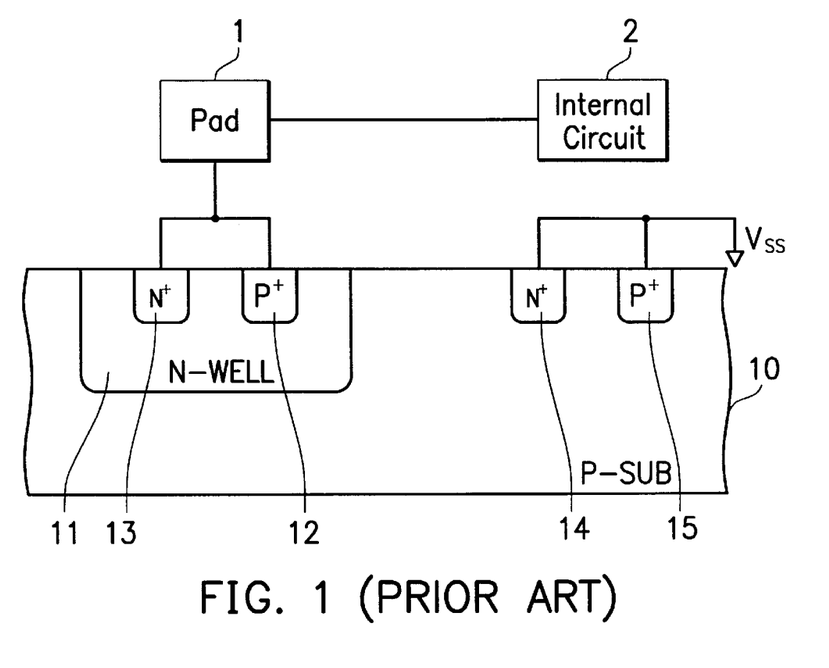
FIG. 1 depicts a cross-sectional view of a conventional lateral silicon-controlled rectifier fabricated onto a semiconductor substrate.

As shown in FIG. 1, the silicon-controlled rectifier is fabricated on a P-type silicon substrate 10 in which an N-well region 11 is formed. A pair of a P-type doped region 12 and an N-type doped region 13 are formed within the extent of the N-well region 11 and spaced apart from each other, while an N-type doped region 14 and a P-type doped region 15 are formed within the extent of the P-type silicon substrate 10 and spaced apart from each other. The P-type doped region 12 and the N-type doped region 13 are connected together to an IC pad 1. The IC pad 1 is electrically connected to an internal circuit 2, which is vulnerable to ESD damage and should be protected by the lateral silicon-controlled rectifier. In addition, the N-type doped region 14 and the P-type doped region 15 are connected together to a potential node $V_{SS}$, which is generally connected to ground under normal operation.

Figure 2:
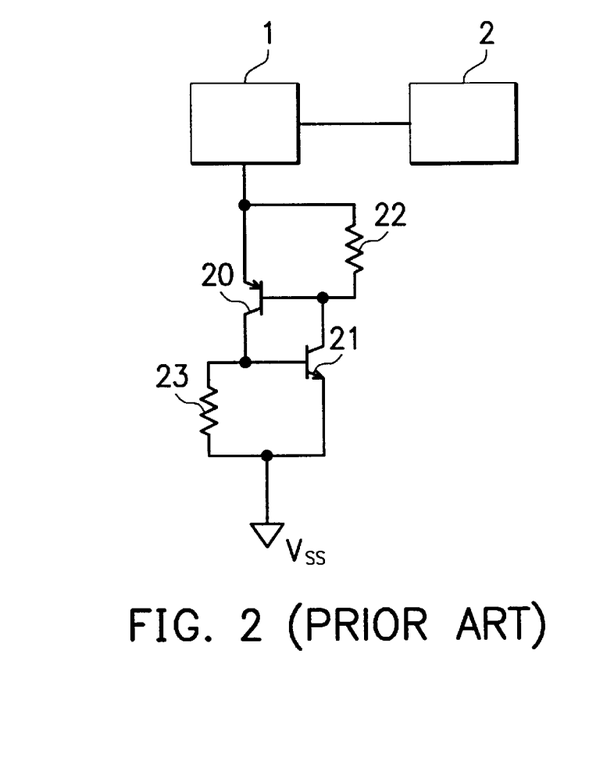
FIG. 2 schematically depicts an equivalent circuit diagram of the conventional lateral silicon-controlled rectifier as shown in FIG. 1.

Accordingly, the P-type doped region 12, the N-well region 11, and the P-type silicon substrate 10 serve as the emitter, base, and collector, respectively, of a PNP bipolar junction transistor 20, while the N-well region 11, the P-type silicon substrate 10, and the N-type doped region 14 serve as the collector, base, and emitter, respectively, of an NPN bipolar junction transistor 21. Referring to FIG. 2, the equivalent circuit diagram of the conventional lateral silicon-controlled rectifier shown in FIG. 1 is schematically depicted. Furthermore, as shown in FIG. 2, resistors 22 and 23 stand for the respective spreading resistance of the N-well region 11 and the P-type silicon substrate 10.

When ESD stress occurs at the IC pad 1, the P/N junction between the N-well region 11 and the P-type silicon substrate 10 is subject to breakdown and then forward biases the P/N junction between the P-type silicon substrate 10 and the N-type doped region 14. Therefore, the lateral silicon-controlled rectifier comprising the PNP transistor 20 and NPN transistor 21 is triggered to conduct the resulting ESD current, and thus bypasses the ESD stress so as to protect the internal circuit 2 from ESD damage.

As mentioned above, triggering the conventional lateral silicon-controlled rectifier to turn on and thus bypass the ESD stress heavily relies on the junction breakdown between the N-well region 11 and the P-type silicon substrate 10. However, both N-well region 11 and the P-type silicon substrate 10 have doping concentrations so low that the trigger voltage of the lateral silicon-controlled rectifier is roughly 30 V or higher. As an example, for CMOS fabrication technology of 0.6~0.8 µm, gate oxides of about 150~200 Å in thickness, practiced in the internal circuit 2, may be damaged at voltages lower than the trigger voltage of the conventional lateral silicon-controlled rectifier.

Figure 3:
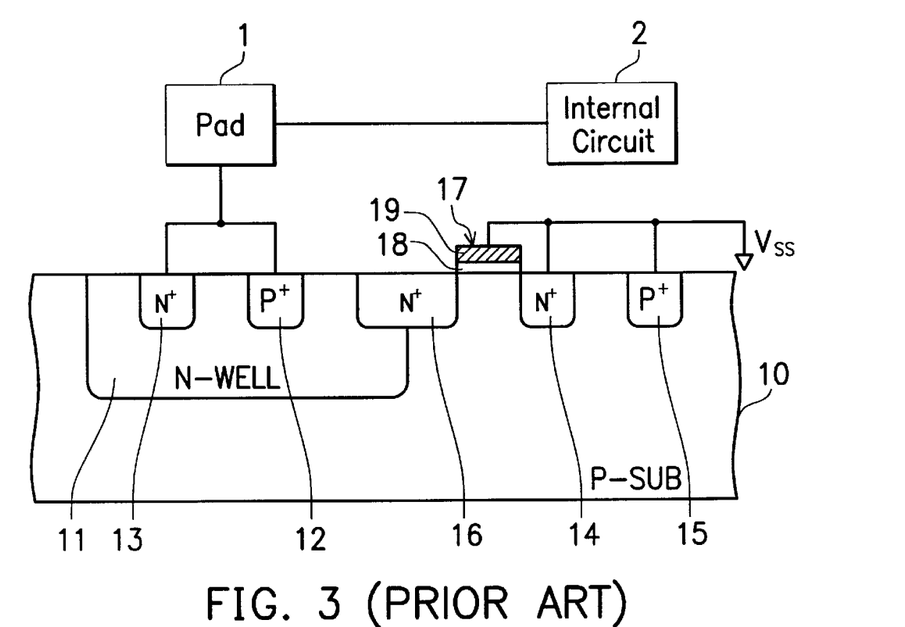
FIG. 3 depicts a cross-sectional view of a conventional ESD protection circuit fabricated onto a semiconductor substrate.

To reduce the trigger voltage, U.S. Pat. No. 5,465,189 has proposed "A LOW VOLTAGE TRIGGERING SEMICONDUCTOR CONTROLLED RECTIFIER" as illustrated in FIG. 3. In addition to those elements disclosed in FIG. 1, another N-type doped region 16 and a gate structure 17 in involved in this conventional ESD protection circuit. The N-type doped region 16 is provided with one portion formed in N-type well region 11 and another portion formed in the P-type silicon substrate 10. In other words, the N-type doped region 16 spans the junction of the N-well region 11 and the P-type silicon substrate 10. The gate structure 17, which is provided with a gate dielectric layer 18 and a gate electrode 19 connected to $V_{SS}$ node, is formed to cover a portion of silicon substrate 10 between the N-type doped regions 14 and 16.

Figure 4:
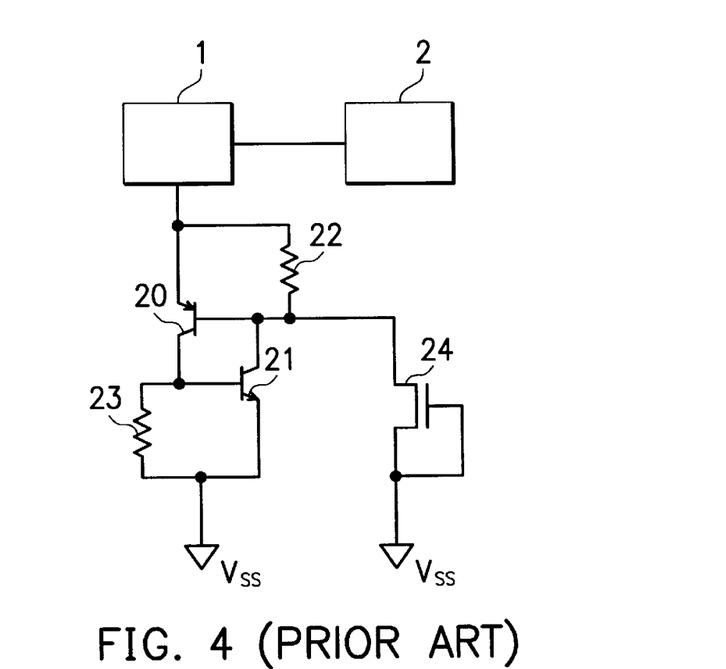
FIG. 4 schematically depicts an equivalent circuit diagram of the conventional ESD protection circuit as shown in FIG. 1.

FIG. 4 is the equivalent circuit of FIG. 3. In FIG. 4, reference numeral 24 stands for an metal-oxide-semiconductor field-effect transistor (MOSFET) constituted by the N-type doped regions 14 and 16, the portion of the silicon substrate 10 between the N-type doped regions 14 and 16, and the gate structure 17. When ESD stress occurs at the IC pad 1, the MOS transistor 24 is subject to breakdown to trigger the lateral silicon-controlled rectifier to conduct a discharge current. Accordingly, the trigger voltage of the ESD protection circuit as shown in FIG. 3 can be lowered to the breakdown voltage of the MOS transistor 24.

However, the MOS transistor 24 can not be integral with an output buffer when the IC pad 1 denotes an output pad. Moreover, as integrated circuit processing advances to smaller dimensions the resistance of the substrate decreases, making it harder to ESD trigger the lateral silicon-controlled rectifier. Therefore, U.S. Pat. No. 5,591,992 discloses an improved ESD protection circuit particularly adaptable for CMOS circuits with low resistance substrates. However, the addition of several resistors requires larger layout area, which is detrimental to miniaturization.

For the foregoing reason, there is a need for an ESD protection circuit provided with a lower trigger voltage so as protect the internal circuit from ESD damage, and minimize the required layout area.

SUMMARY OF THE INVENTION

Therefore, an object of the present invention is to provide an ESD protection circuit having a trigger voltage less than voltages at which an internal circuit may be damaged.

Another object of the present invention is to provide an ESD protection circuit consuming less layout area.

The present invention achieves the above-indicated objects by providing an electrostatic discharge protection circuit, which comprises an NMOS transistor and a silicon-controlled rectifier. The NMOS transistor is configured with one source/drain region connected to a first node, and its gate as well as another source/drain region connected to a second node. The silicon-controlled rectifier comprises a PNP transistor, an NPN transistor, and a resistor. The PNP transistor is provided with a first emitter connected to the first node, a first base disconnected from the first node, and a first collector. The NPN transistor is provided with a second emitter connected to the second node, a second base connected to the first collector and a second collector connected to the first base. However, the resistor is connected between the second base and the second node. The NMOS transistor enters breakdown to trigger the silicon-controlled rectifier to conduct a discharge current when electrostatic discharge stress occurs between the first node and the second node.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

According to the present invention, an ESD protection circuit comprises an MOS transistor, an open-base PNP bipolar junction transistor and an NPN bipolar transistor so as to lower the voltage at which the junction constituted by an N-well region and a P-type substrate enters breakdown. Accordingly, the ESD protection circuit of the present invention has a trigger voltage lower than voltages at which an internal circuit may be damaged.

Figure 5:
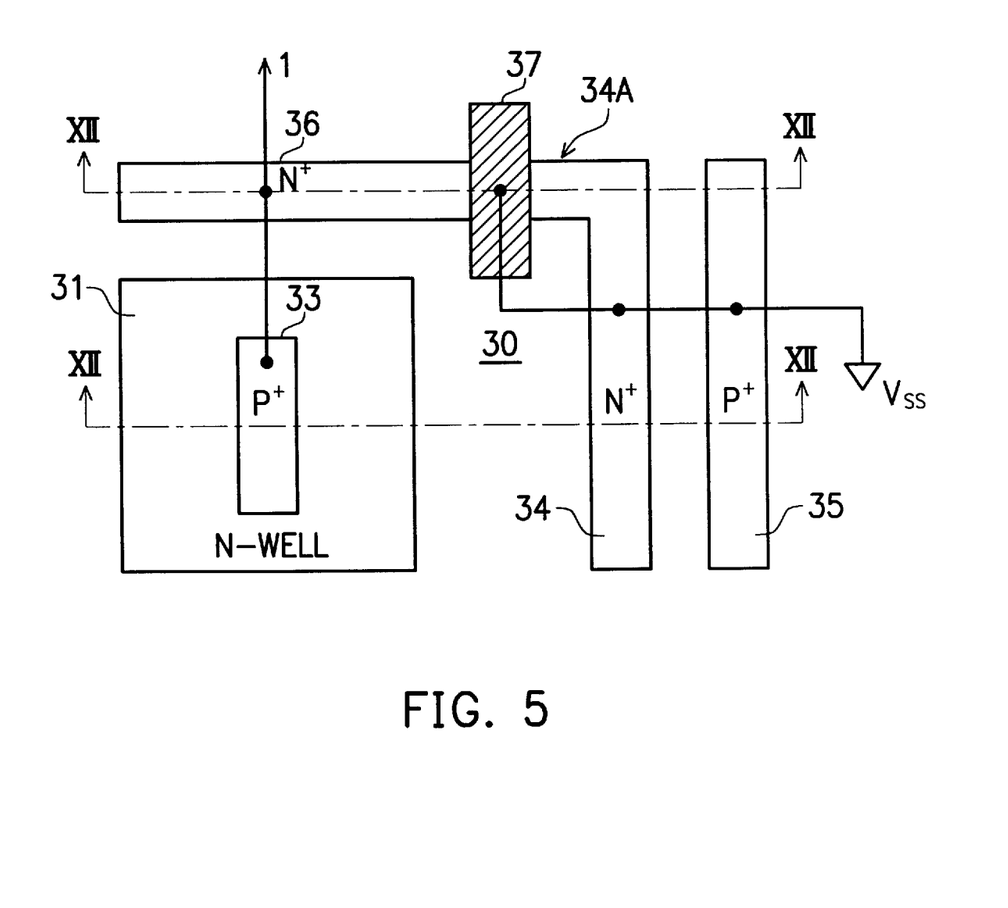
FIG. 5 depicts a top view of one preferred embodiment of the present invention fabricated onto a semiconductor substrate.

Referring to FIG. 5, an ESD protection circuit according to one preferred embodiment of the present invention fabricated onto a semiconductor substrate is illustrated in a top view. In this embodiment, the ESD protection circuit is generally fabricated onto a P-type semiconductor layer 30 in which an N-type semiconductor layer 31 is formed to establish a P/N junction 32 therebetween. Preferably, the P-type semiconductor 30 can be a P-type silicon substrate, and the N-type semiconductor 31 can be a well region formed in the P-type substrate by diffusion processing, accordingly. Note that a first N-type doped region 34 and a second P-type doped region 35 are formed within the extent of the P-type semiconductor layer 30 and spaced apart from each other, but only a first P-type doped region 33 formed in the N-type semiconductor layer 31. The first P-type doped region 33 is electrically connected to the IC pad 1. The IC pad 1 is electrically coupled to the internal circuit 2, which is vulnerable to ESD damage and should be protected by the ESD protection circuit of the present invention. Moreover, the first N-type doped region 34 and the second P-type doped region 35 are connected together to a potential node $V_{SS}$, which is generally coupled to ground under normal operation.

In addition, a second N-type doped region 36 is formed in the P-type semiconductor layer 30, and provided with an extension portion 34A which is spaced apart from the first N-type doped region 34, thereby the second N-type doped region 36 is located in proximity to the N-type semiconductor layer 31. A gate structure 37, comprising a gate dielectric layer 38 and a gate electrode 39 connected to the $V_{SS}$ node from the bottom to the top, covers the portion of the P-type semiconductor layer 30 between the N-type doped region 34 and 36. Preferably, the gate dielectric layer 38 is made of silicon oxides by means of thermally-grown processing, and the electrode 39 is made of polysilicon by means of low-pressure chemical vapor deposition processing.

Figure 6:
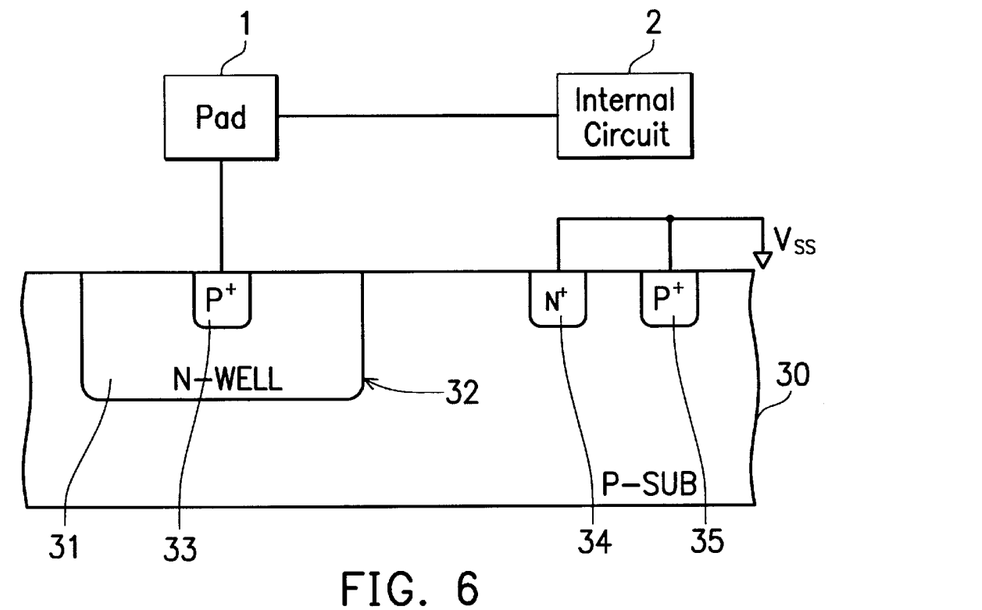
FIG. 6 depicts a cross-sectional view taken along the XI—XI line of FIG. 5.

Referring to FIG. 6, the cross-sectional view taken along a line XI—XI of FIG. 5 is illustrated. In FIG. 6, the first P-type doped region 33, the N-type semiconductor layer 31, and the P-type semiconductor layer 30 serve as the emitter, base, and collector, respectively, of a PNP bipolar junction transistor 40. The N-type semiconductor layer 31, the P-type semiconductor layer 30, and the first N-type doped region 34 serve as the collector, base, and emitter, respectively, of an NPN bipolar junction transistor 41. Therefore, the PNP transistor 41 and the NPN transistor 41 constitute a silicon-controlled rectifier.

Figure 7:
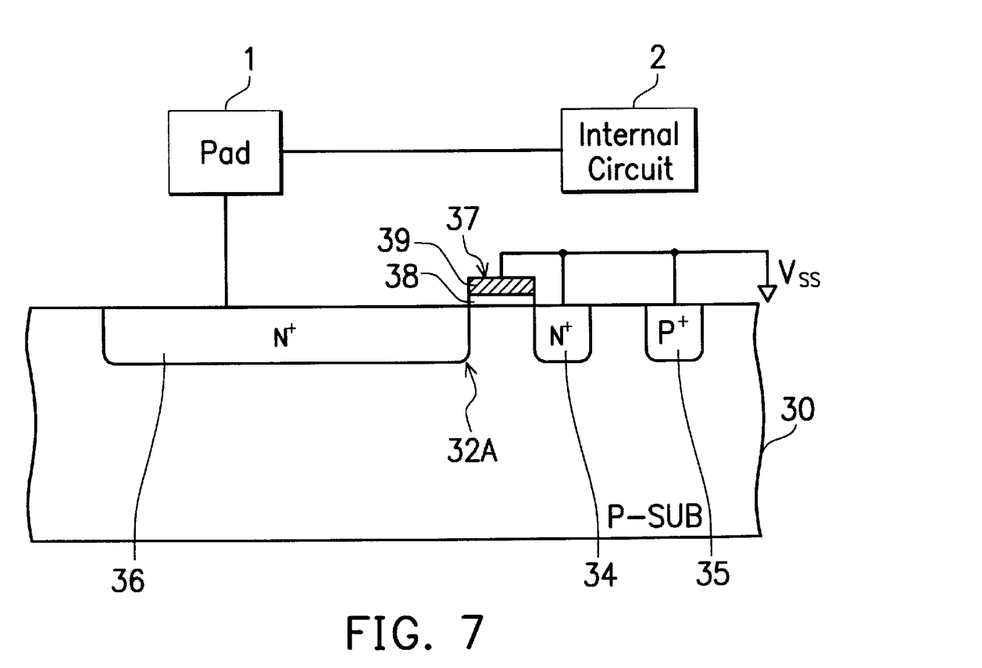
FIG. 7 depicts a cross-sectional view taken along the XII—XII line of FIG. 5.

Referring to FIG. 7, the cross-sectional view taken along a line XII—XII of FIG. 5 is illustrated. A metal-oxide-semiconductor field-effect transistor (MOSFET) 43 is constituted by the N-type doped regions 34 and 36, the portion of the semiconductor layer 30 between the N-type doped regions 34 and 36, and the gate structure 37.

Figure 8:
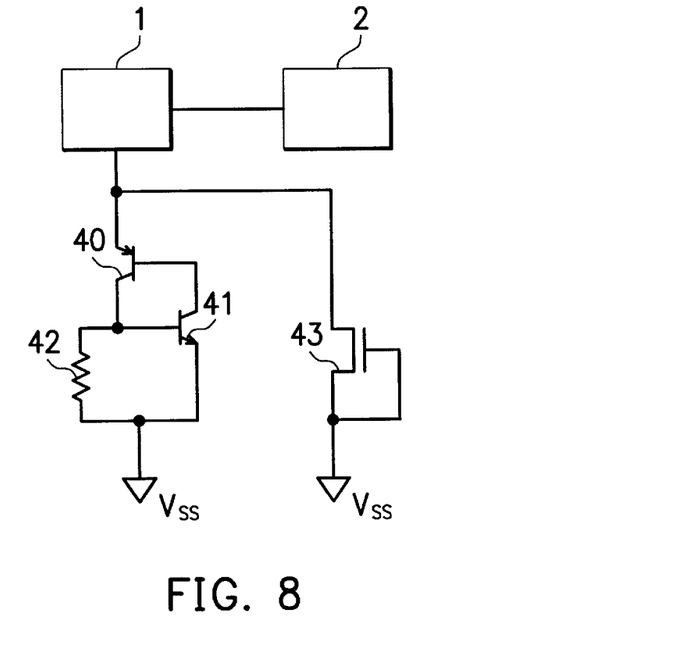
FIG. 8 schematically depicts an equivalent circuit diagram of FIG. 5.

Referring to FIG. 8, the equivalent circuit diagram of the ESD protection circuit according to one preferred embodiment of the present invention shown in FIG. 3 is schematically depicted. In FIG. 8, a resistor 42 stands for the spreading resistance of the P-type semiconductor layer 30.

As shown in FIGS. 6 and 7, when ESD stress occurs at the IC pad 1, the P/N junction of the second N-type doped region 36 and the P-type semiconductor 30 enters avalanche breakdown. In other words, the drain junction of the MOS transistor 43 enters breakdown to generate electron-hole pairs, whereby electrons flow to the second N-type doped region 36 and holes flow to the second P-type doped region 35. The hole current flowing to the second P-type doped region 35 boosts the voltage of the P-type semiconductor layer 30 so as to forward bias the P/N junction between the P-type semiconductor layer 30 and the first N-type doped region 34. If the second N-type doped region 34 is spaced from the N-type semiconductor layer 31 by a spacing of no more than 15 lm, the silicon-controlled rectifier can be triggered to snapback and thus conduct the resulting ESD current to bypass the ESD stress thereby protecting the internal circuit 2 from ESD damage. Accordingly, the trigger voltage of the ESD protection circuit according to the present invention is the breakdown voltage, 8~12 V, of the MOS transistor 43.

Moreover, since only the first P-type doped region 33 is formed in the N-type semiconductor layer 31 and no contact region provided therein (as compared with the N-type region 13 shown in FIG. 1), the N-type semiconductor layer 31 is thus floating. In other words, the PNP bipolar junction transistor 40 is configured with open-base as shown in FIG. 6. Consequently, the floating N-type semiconductor layer 31 can lower the breakdown voltage, based on the expression disclosed in the B. J. Baliga, "POWER SEMICONDUCTOR DEVICES," Chapter 5, Page 236, as follows:

$$BV_{CEO} = BV_{CBO} \sqrt[n]{\beta}$$

Therefore, the silicon-controlled rectifier enters snapback at a holding voltage of about 1~3 V.

Accordingly, the ESD protection circuit of the present invention is triggered to bypass the ESD stress at the breakdown voltage of the MOS transistor 43, and then clamp the potential difference of the two circuit nodes (e.g., the IC pad 1 and the $V_{SS}$ node) to the holding voltage at which the silicon-controlled rectifier enters snapback.

Figure 9:
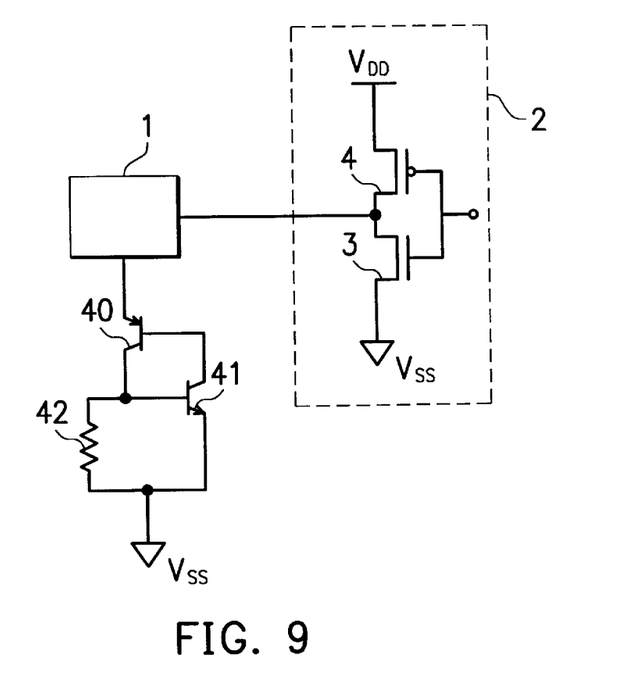
FIG. 9 schematically depicts the equivalent circuit diagram of another preferred embodiment of the present invention.

Referring to FIG. 9, the equivalent circuit diagram of another preferred embodiment of the present invention is schematically depicted. In the drawing, the IC pad 1 denotes an output pad, which is connected to an output buffer of the internal circuit 2. Generally speaking, the output buffer consists of an NMOS transistor 3 and a PMOS transistor 4, whose drains are connected together to the IC pad 1, and whose gates are connected together to be an output terminal of the output buffer. However, respective sources of the NMOS transistor 3 and the PMOS transistor 4 are connected to the $V_{SS}$ node and a $V_{DD}$ node. In accordance with another preferred embodiment of the present invention, the MOS transistor 43 of FIG. 8 has been integrated with the output buffer. Therefore, the NMOS transistor 3 concurrently plays the roles of one component of the output buffer and the triggering MOS transistor 43 as well.

Figure 10:
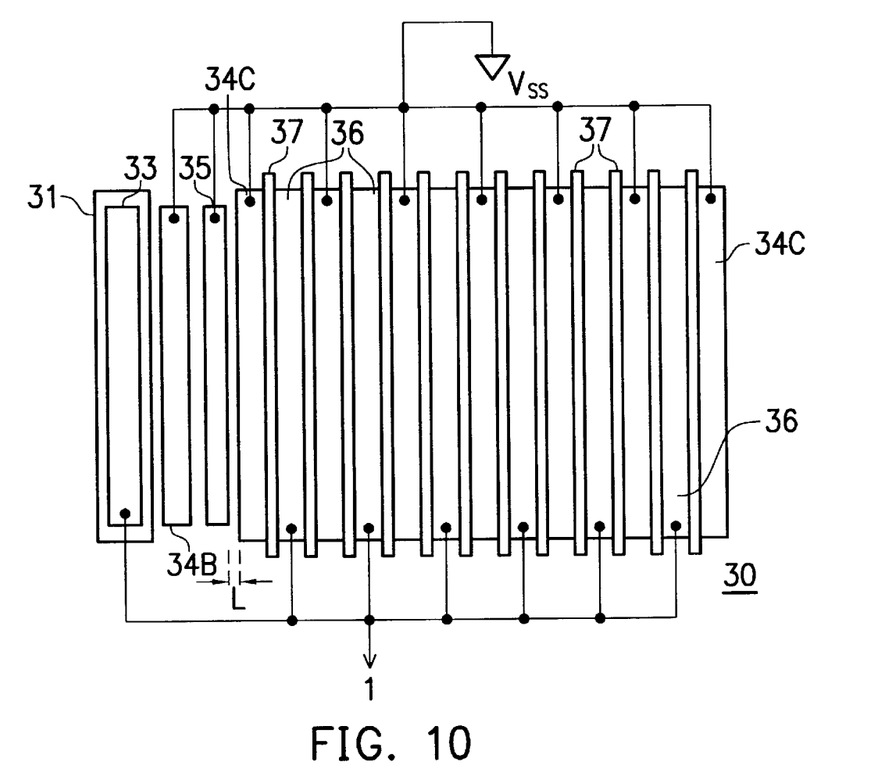
FIG. 10 depicts a top view of circuit illustrated in FIG. 9 fabricated onto a semiconductor substrate.

FIG. 10 depicts a top view of the circuit illustrated in FIG. 9 fabricated onto a semiconductor substrate. Note that the NMOS transistor 3 shown in FIG. 9 is implemented by a multiple-finger layout, wherein those reference numerals same as shown in FIG. 5 denote the same elements. As compared to FIG. 5, FIG. 10 is characterized in that the first N-type doped region 34 is divided into regions 34B and 34C to serve as the emitter of the NPN transistor 41 and the source of the NMOS transistor 3, respectively, but which are electrically connected together. Furthermore, the gate structure 37 and the gate the PMOS transistor are tied together.

When, ESD stress occurs at the IC pad 1, the NMOS transistor 3 enters avalanche breakdown to generate electron-hole pairs, whereby electrons flow to the second N-type doped region 36 and holes flow to the second P-type doped region 35. The hole current flowing to the second P-type doped region 35 boosts the voltage of the P-type semiconductor layer 30 so as to forward bias the P/N junction between the P-type semiconductor layer 30 and the divided N-type doped region 34B and 34C. If the NMOS transistor 3 is spaced from the silicon-controlled rectifier by a distance of no more than 15 μm, the silicon-controlled rectifier can be triggered to snapback and thus conduct the resulting ESD current to bypass the ESD stress, thereby protecting the internal circuit 2 from ESD damage. Accordingly, the trigger voltage of the ESD protection circuit according to the present invention is the breakdown voltage, 8~12 V, of the MOS transistor 43.

Accordingly, the ESD protection circuit of the present invention is triggered to bypass the ESD stress at the breakdown voltage of the NMOS transistor 3, ranging from about 7 V to about 9 V. Thereafter, the potential difference of two circuit nodes, as an example, between the IC pad 1 and the $V_{SS}$ node, can be clamped to the holding voltage (e.g., 1~3 V) at which the silicon-controlled rectifier enters snapback.

Because the NMOS transistor 3 is merely in charge of triggering and the resulting ESD current actually flows through the silicon-controlled rectifier, the spacing from the drain to the gate can be saved by 60% (e.g., decreased from about 5 μm to 2 μm), and thus the required layer area occupied by the wholly ESD protection circuit can be reduced as much as 30% as well. In addition, the decreased layout area decreases the parasitic capacitance of the IC pad 1.

Figure 11:
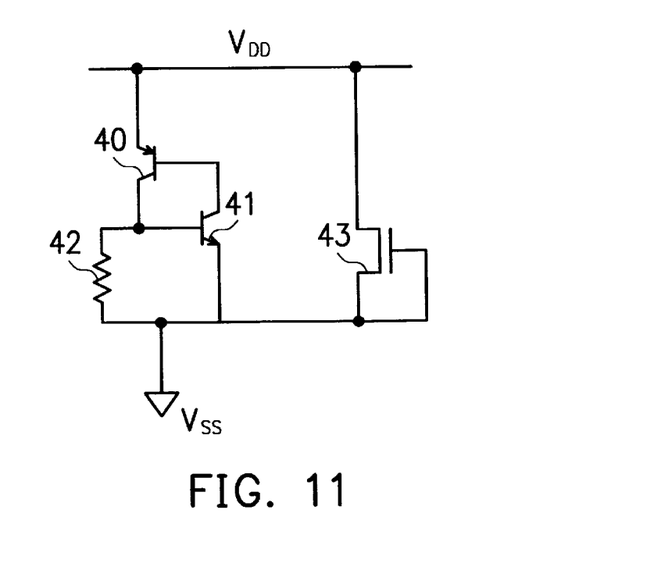
FIG. 11 schematically depicts an equivalent circuit diagram of further another preferred embodiment of the present invention.

Referring to FIG. 11, the equivalent circuit diagram of yet another preferred embodiment of the present invention with the first P-type doped region 33 and the second N-type doped region 35 are electrically connected to $V_{DD}$ node instead of being connected to the IC pad 1 is schematically depicted. Under normal operation 5 V or 3.3 V id applied to the $V_{DD}$ node.

In conclusion, the MOS transistor is used to trigger the silicon-controlled rectifier comprising the NPN bipolar junction transistor and the open-base PNP bipolar transistor at a low voltage to enter snapback according to the present invention. Therefore, the ESD protection circuit of the present invention has a trigger voltage less than the voltages at which the internal circuit 2 may be damaged, and two circuit nodes at which ESD stress occurs can be clamped to a decreased holding voltage. In addition, the fact that no contact region is formed in the N-type semiconductor layer reduces the layout area required by the ESD protection circuit.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to understand the invention to practice various other embodiments and make various modifications suited to the particular use contemplated. It is intended that the scope of the invention be defined by the following claims and their equivalents.

What is claimed is:

1. An electrostatic discharge protection circuit, comprising:

a semiconductor layer of a first conductivity type;

a floating semiconductor layer of a second conductivity type in contact with said semiconductor layer of a first conductivity type to establish a first junction;

a first doped region of the first conductivity type formed in said semiconductor layer of a second conductivity type and connected to a first node;

a first doped region of the second conductivity type formed in said semiconductor layer of a first conductivity type and connected to a second node;

a second doped region of the second conductivity type spaced apart from said first doped region of the second conductivity type, formed in said semiconductor layer of a first conductivity type to establish a second junction therebetween, and connected to said first node;

a gate structure overlying a portion of said semiconductor layer of a first conductivity type between said doped regions of the second conductivity type; and a second doped region of the first conductivity type formed in said semiconductor layer of a first conductivity type and connected to said second node;

wherein said second junction enters breakdown to trigger the conduction of a discharge current flowing through said first junction when electrostatic discharge stress occurs between said first node and said second node.

2. The electrostatic discharge protection circuit as claimed in claim 1, wherein the first conductivity type is P-type and the second conductivity type is N-type.

3. The electrostatic discharge protection circuit as claimed in claim 2, wherein said first node is connected to an integrated circuit pad.

4. The electrostatic discharge protection circuit as claimed in claim 3, wherein said second node is powered by a relatively low potential under normal operation.

5. The electrostatic discharge protection circuit as claimed in claim 4, wherein said gate structure comprises a dielectric layer and an electrode.

6. The electrostatic discharge protection circuit as claimed in claim 5, wherein said electrode is powered by said relatively low potential under said normal operation.

7. The electrostatic discharge protection circuit as claimed in claim 2, wherein said first node is powered by a relatively high potential under normal operation.

8. The electrostatic discharge protection circuit as claimed in claim 7, wherein said second node is powered by a relatively low potential under said normal operation.

9. The electrostatic discharge protection circuit as claimed in claim 8, wherein said gate structure comprises a dielectric layer and an electrode.

10. The electrostatic discharge protection circuit as claimed in claim 9, wherein said electrode is connected to said relatively low potential under said normal operation.

11. An electrostatic discharge protection circuit deployed at an output buffer, said electrostatic protection circuit comprising:

a semiconductor layer of a first conductivity type;

an NMOS transistor integral with said output buffer having pairs of source/drain regions and formed on said semiconductor layer of a first conductivity type;

a floating semiconductor layer of a second conductivity type in contact with said semiconductor layer of a first conductivity type to establish a junction;

a first doped region of the first conductivity type formed in said semiconductor layer of a second conductivity type, wherein both said first doped region of the first conductivity type and one of said pairs of source/drain regions are connected to a first node;

a second doped region of the first doped region formed in said semiconductor layer of a first conductivity type and connected to a second node; and a first doped region of the second conductivity type formed in said semiconductor layer of a first conductivity type, wherein both said first doped region of the second conductivity type and another of said pairs of source/drain regions are connected to said second node;

wherein said first doped region of the first conductivity type, said semiconductor layer of a second conductivity type, said semiconductor layer of a first conductivity type, and said first doped region of the second conductivity type constitute a silicon-controlled rectifier while said silicon-controlled rectifier is spaced from said NMOS transistor by a distance of no more than 15 $\mu$m; and said NMOS transistor enters breakdown to trigger said silicon-controlled rectifier to conduct a discharge current flowing through said junction when electrostatic discharge stress occurs between said first node and said second node.

12. The electrostatic discharge protection circuit as claimed in claim 11, wherein the first conductivity type is P-type and the second conductivity type is N-type.

13. The electrostatic discharge protection circuit as claimed in claim 11, wherein said first node is connected to an integrated circuit pad while said second node is powered by a relatively low potential under normal operation.

14. The electrostatic discharge protection circuit as claimed in claim 11, wherein said NMOS transistor is implemented by multiple-finger layout.

15. An electrostatic discharge protection circuit, comprising:

a silicon-controlled rectifier connected between a first node and a second node, said silicon-controlled rectifier having a floating well formed in a semiconductor substrate; and a MOS transistor connected in parallel to said silicon-controlled rectifier, said MOS transistor having a drain region formed in said semiconductor substrate and spaced from said floating well by a distance of no more than 15 $\mu$m;

said MOS transistor entering breakdown to trigger said silicon-controlled rectifier conducting a discharge current when an electrostatic discharge potential occurs between said first node and said second node.

16. The electrostatic discharge protection circuit as claimed in claim 15, wherein said first node and said second node are powered by a relatively high potential and a relatively low potential, respectively, under normal operation.

17. The electrostatic discharge protection circuit as claimed in claim 15, wherein said first node is connected to an integrated circuit pad while said second node is powered by a relatively low potential under normal operation.

18. The electrostatic discharge protection circuit as claimed in claim 17, wherein said integrated circuit pad is an output pad connected to an output buffer.

19. The electrostatic discharge protection circuit as claimed in claim 18, wherein said MOS transistor is integrated into said output buffer.

* * * * *